PRE-IF NOISE SILENCER USING A BI-DIRECTIONAL TRANSISTORIZED GATE

Filed Oct. 30, 1963 3 Sheets-Sheet 1

INVENTOR
William K. Squires

Shlesinger, Shlesinger & Arkwright

ATTORNEYS

Aug. 29, 1967 W. K. SQUIRES 3,339,144

PRE-IF NOISE SILENCER USING A BI-DIRECTIONAL TRANSISTORIZED GATE

Filed Oct. 30, 1963 3 Sheets-Sheet 2

INVENTOR
William K. Squires

Shlesinger, Shlesinger & Arkwright
ATTORNEYS

INVENTOR
William K. Squires

BY Shlesinger, Shlesinger & Arkwright
ATTORNEYS

United States Patent Office 3,339,144
Patented Aug. 29, 1967

3,339,144
PRE-IF NOISE SILENCER USING A BI-DIRECTIONAL TRANSISTORIZED GATE

William K. Squires, Martinsville, N.J., assignor to Squires-Sanders, Inc., Watchung, N.J., a corporation of New Jersey Filed Oct. 30, 1963, Ser. No. 320,034
10 Claims. (Cl. 325—478)

ABSTRACT OF THE DISCLOSURE

A noise silencer is used in the radio receiver to interrupt passage of the radio frequency signal whenever noise occurs. The presence of noise in the radio frequency signal is sensed by an envelope detector which feeds the signal to a pulse former which is directly connected to the transistor gate. The pulse supplied to the gate has uniform amplitude and has a duration equal to that of the impulse noise. A bi-polarized switching transistor is used as a gate element in the transistor circuit.

This invention relates to radio communication receivers, and more particularly to a means of eliminating noise in such units.

In recent years, the increase of impulse noises has correspondingly increased interference with good radio signal reception. Impulse noise is caused by automobile ignition systems, power system arc-overs and leaks, electric motors, neon signs with automatic controllers, and any other instruments which produce an arc accompanying the making or breaking of an electrical circuit. Thunderstorms have also presented a troublesome problem to clear signal reception. The noise pulses resulting from such disturbances is characteristically very high in peak amplitude and of short duration.

Various attempts have been made to overcome such disturbances by incorporating in radio receiver circuits signal limiters and other types of squelch circuits. However, although such circuits have been somewhat effective, they have not completely solved the problem, and much interference and spurious noises still come through with the signal.

This invention contemplates a new and different approach to the problem, and has produced truly remarkable results in the effort to overcome the problems presented by impulse noise.

Accordingly, it is the principal object of this invention to provide a circuit for use in radio communication receivers which is much more successful in eliminating impulse noise than previous circuits.

It is also an object of this invention to provide a unique circuit arrangement in which noise impulses in the signal are silenced, and the incoming signal simultaneously cutoff for the duration of such noise.

It is a still further object of this invention to provide a noise silencer circuit which acts on a wide band radio frequency signal to eliminate noise impulses in the signal, and relies on selectivity in the following stages to smooth over the consequent gap produced in the signal.

It is another object of this invention to provide a unique gating arrangement which is used prior to the IF stage of a receiver and produces little or no disturbance to the desired signal as it passes through the gate.

It is a still further object of this invention to provide a noise silencer circuit using a gate in which a wide spectrum of the signal band is scanned for noises, and, upon sensing a noise in the signal, issues a pulse to activate the gate.

A still further object of this invention is to provide a receiver which will give an audible signal free from static, which could not otherwise be heard when noise is present in the incoming signal.

A still further object of the invention is to provide a gate which operates at low signal levels and which is very fast in operation.

A still further object of the invention is to provide a noise silencer circuit in which noise pulses are not lengthened by the selectivity of the receiver.

A still further object of the invention is to provide a silencer circuit which is actuated by signals over a very wide band in which noise energy may be contained.

A still further object of the invention is to provide a noise silencer which is operated by noise pulses or signals.

A still further object of the invention is to provide a radio signal gate which introduces no noise or pulse of its own, in no way distorts or seriously affects the signal, is quick-acting, and operates at low signal levels.

Other objects and advantages of my invention reside in the details of construction, arrangement, combination of the various parts of my apparatus as hereinafter more fully set forth, as specifically pointed out in my claims, and illustrated in the accompanying drawing, in which:

Figure 1:
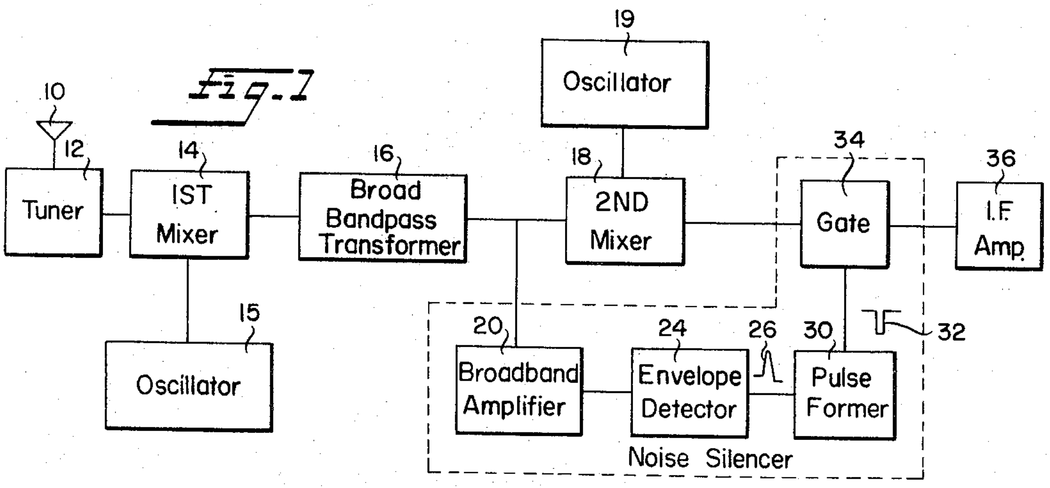
FIGURE 1 shows in block form a preferred embodiment of the invention, illustrating the use of the noise silencer in a radio receiver prior to the IF stage.

Referring particularly to FIGURE 1, where a preferred circuit is shown in block diagram, the signal from antenna 10 is passed through the tuning circuit 12 to the first mixing stage 14. Both tuner 12 and mixing stage 14 pass all incoming signals and noise in a wide section of the spectrum, 500 kilocycles in width for example.

The first mixer 14 combines the incoming wide band signal with the oscillator signal from local oscillator 15 to produce (say) a 5.0- to 5.5-megacycle output. This mixing stage should preferably be very linear. The balanced linear mixer set forth in my co-pending application, Ser. No. 304,006 is therefore preferably used in the mixing stages of this unit.

The broad bandpass transformer 16 will pass the 5 to 5.5-megacycle signal so that the 500-kilocycle bandwidth is applied to the second mixing stage 18, and to the noise silencer circuit.

This broad signal band is passed through the second mixer 18 and mixed with the output of oscillator 19 to give a one megacycle output which is passed through gate 40, and then filtered and amplified in a narrow band (typically two kilocycles wide) IF amplifier.

The signal and noise output from the broad bandpass transformer 16 also pass through a broad band amplifier 20 where they are amplified to a high level, such as a two to three volts peak. Any one signal occupies only a small fraction of this band, a few kilocycles for example, while a noise pulse occupies all or more of the 500-kilocycle band. Therefore, the noise pulse exceeds the signal at the output of the envelope detector 24, where it is envelope detected and filtered, with the A.C. component being fed to the pulse former 30.

Pulse former 30 is normally inactive, being biased beyond cutoff, but when sufficient signal is applied to it, sends out a current pulse generally indicated at 32 which is sharp and uniform for a wide range of incoming signals.

The duration of the pulse 32 is determined by the duration and amplitude of the signal 26 sent from the envelope detector 24. Pulse 32 acts to close gate 34 and to keep it closed for the length of time it is applied to the gate. Consequently, the signal output from the second mixing stage 18 is cutoff at gate 34 so that no signal is supplied to the IF amplifier section 36 during the time a noise signal is present in the signal.

For successful operation it is necessary that the gate be extremely quick acting. It is also important that no signal is introduced when the gate is activated or deactivated. This is extremely important inasmuch as the silencing takes place in the pre IF section, and any perturbation introduced by the gate would be considerably amplified in the later stage.

The broad idea involved in using the arrangement set forth above, is to completely cut out all signals for the very short length of time the high energy impulse noise signals are present, and to rely on the selectivity in the following stages for smoothing the wave envelope.

Figure 2:
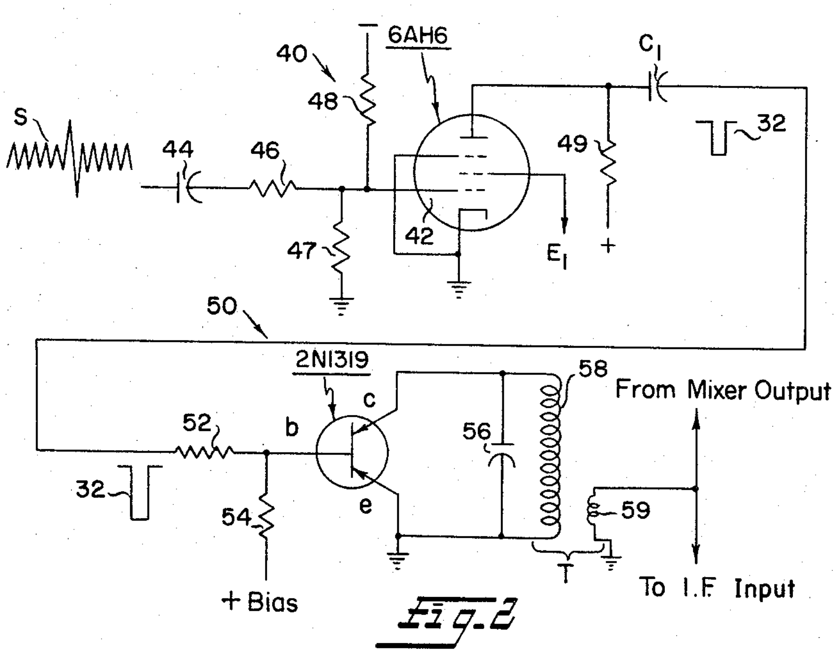
FIGURE 2 shows a pulse forming and gating circuit which could be used in the radio receiver of FIGURE 1.

FIGURE 2 shows a representative pulse forming circuit generally indicated at 40, wherein the signal is applied to a 6AH6 pentode which has a high transconductance. Incoming signals are applied to the control grid 42 through capacitor 44 and resistor 46, the grid being biased below cutoff (by resistors 47 and 48) for the supplied screen voltage $E_1$ which is low and approximately 25 volts. As a result there is no signal output unless there is a positive noise peak. When this occurs, a current pulse is emitted which is very limited by the screen voltage, and over a wide range of input signals will produce an identical amplitude output current pulse.

Capacitor 44 eliminates the low frequency signal content, and resistor 46 and the input capacitance of the tube combine to eliminate the high frequency carrier content (of five to five and a half megacycles). Therefore, the tube conducts only on noise pulses which exceeds its cutoff potential. The screen and plate voltages (the latter controlled by resistor 49) are picked to limit the current pulse output of the tube to the value required by the transistor gate.

Large noise pulses cause the tube to draw grid current, thus limiting pulse amplitude due to the drop across resistor 46. The current pulse from the tube is very fast in the negative direction because the tube has a very low impedance when conducting. As a result, the tube will produce an identical amplitude current pulse over a very wide range of input signal amplitudes.

The output from the pulse forming tube is coupled through capacitor $C_1$ to an unusual gate generally indicated at 50.

The gate circuit when closed interrupts passage of the signal from the mixer to the IF stage by producing a low impedance across the tuned circuit to the IF stage. In this arrangement, the transistor acts as a short across high impedance transformer T for the duration of the pulse received from the pulse forming stage.

The pulse is fed through resistor 52 to an RCA 2N1319 bi-polarized PNP switching transistor which is biased with positive base voltage by resistor 54 to cut-off, to the point where the collector-emitter impedance is extremely high and approaches infinity. The "gate-off" pulse causes a small collector-emitter current to flow, reducing the collector-emitter impedance to a very low value and producing a 90 to 100 decibel gate-off attenuation and less than one half microvolt of pulse leakage.

This shorts the transformer for the duration of the "gate-off" pulse by reducing collector-emitter impedance to a very low value. A pulse will not appear across the transformer T, since no collector-base current flows.

It should be noted that the pulse former amplifies the noise pulse in the scanned spectrum, and at the same time limits all pulses to the same amplitude, these pulses in turn being used to actuate the gate to close it for the duration of the pulse. Since both the gate and the preceeding amplifiers are broad bandwith, the gate is closed very quickly (1 to 2 microseconds) and opened again equally quickly when the pulse stops. This arrangement quiets the receiver for the duration of time in which a noise signal appears in the spectrum, and produces negligible disturbance of the signal being transmitted from the mixer to the IF stage.

Figure 3:
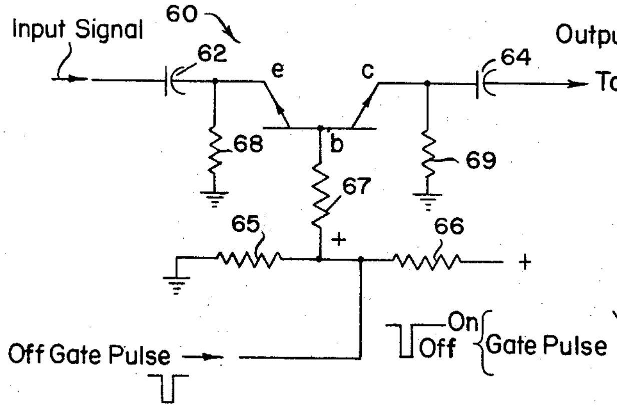
FIGURE 3 shows a special transistor gate which could be used in the receiver circuit shown in FIGURE 1.

FIGURE 3 shows another form of the gate generally indicated at 60 which also performs extremely well, and slightly out-performs the gating arrangement shown in FIGURE 2. This modification employs what might be described as a "series" gate, as contrasted to the "shunt" gating arrangement used in FIGURE 2.

The signal output from the mixing stages are passed through capacitor 62 and a bi-directional NPN switching transistor which is an RCA 2N1169, the signal being fed into the emitter *e* and out the collector *c* through capacitor 64 to the intermediate frequency stages.

The same pulse source as described in FIGURE 2 is also used in this modification. Resistors 65 and 66 bias the transistor so that in the absence of a gate pulse the emitter-collector impedance is very low, and little insertion loss is encountered.

Resistor 67 prevents the emitter-base current from flowing when large input signals are applied to the transistor, thereby acting as a linearizing resistor, greatly increasing the effective range of signals over which the silencer will operate. The range is from 0.5 microvolt to 2.5 volts. Resistors 68 and 69 are used to provide proper bias for the collector and emitter electrodes. When a negative "off" pulse is applied to the base *b*, flow of current from base to emitter ceases, and the emitter-collector impedance becomes very high (½ to 1 megohm). The value of resistance 68 is considerably less than that of resistance 69, to preclude D.C. current flowing in the output lead of transistor 60. If such current did flow, a large pulse would appear in the transistor output causing a large signal perturbation in the intermediate frequency stage.

This modification, as well as being considerably simpler and cheaper than the gate circuit of FIGURE 2, also performs more effectively. The gate has better linear behavior when large signals are applied, no tuned circuit is required, and there is less disturbance of the signal when the transistor is activated or deactivated.

In "open" operation, the impedanec between emitter and collector has a very high value, which is over one megohm. In use the transistor gate will handle fairly large signals without producing cross modulation or overloading, the signals are in the range of 1 to 2 volts. When closed i.e., without a pulse, the impedance of the gate between collector and emitter is extremely low, being only a few ohms, and current flow is between base and emitter with almost none going to the collector. When the base is pulsed negatively with respect to the emitter, the base-emitter current ceases, and the impedance between the emitter and the collector increases to the very high value of over a megohm.

One of the important aspects to consider in the selection of the particular transistor used was the requirement that both the positive and negative characteristic curves for the transistor be almost identical, and the emitter-base current curve, when bias is applied be very steep and be linear for a wide range of emitter-collector currents with little change in emitter-base current value. The RCA 2N1169 bi-directional NPN transistor fits these requirements.

Figure 4:
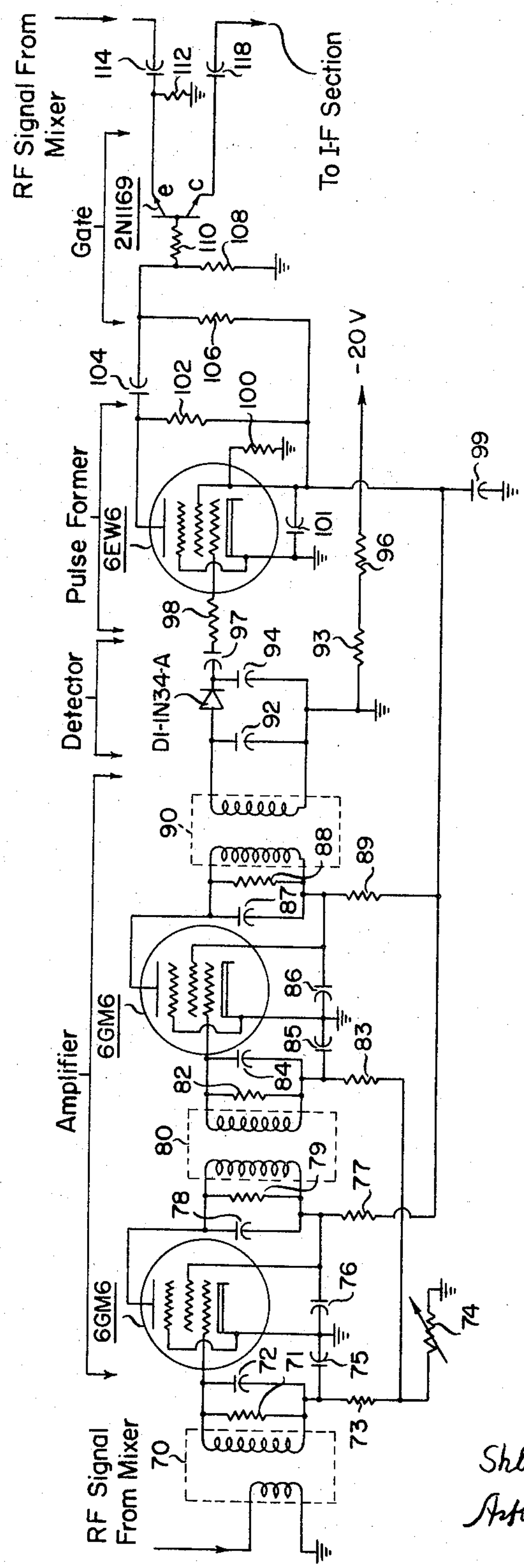
FIGURE 4 shows a noise silencer circuit which is preferably used in the receiver shown in FIGURE 1.

A specific noise silencer circuit is shown in FIGURE 4, showing the respective amplifier, detector, pulse former, and gate circuits. This circuit is preferably used in conjunction with the pre-IF receiver shown in block diagram in FIGURE 1. The gate shown is the preferred embodiment described in FIGURE 3.

FIGURE 4 shows a circuit for the noise silencer as it would be used with two linear mixer stages, preferably the balanced linear mixers as set forth in my co-pending application Ser. No. 304,006, filed on Aug. 23, 1963.

Referring particularly to FIGURE 4 the signal from the mixer is fed through the broad bandpass transformer (5 to 5½ megacycles) from where it is passed through the two 6GM6 amplifier stages. These are two high transconductance tubes which bring all noise and signals at 5 to 5½ megacycles to the level of several volts.

The threshold control for setting the bias on these tubes is controlled by variable resistor 74. Transformer 80 is used to couple both stages and transformer 90 is used to couple the second amplification stage with the detector circuit. Both transformers 80 and 90 will pass the broad band signals of 500 kilocycles width.

Envelope detection is used on the broad band signal by using, a IN34A diode. The signal peaks are from 1 to 3 volts. Any one signal occupies only a small fraction of the bandwidth, two kilocycles for example, while a noise pulse occupies all or more of the 500-kilocycle bandwidth. Therefore, the pulse will exceed the signals and the noise pulse detector thereby generates the pulse which is passed to the pulse former through a filter network which is A.C. coupled to remove the D.C. component.

The pulse former is a 6EW6 tube which operates with a very low screen voltage and conducts only on the positive noise peaks. The operation of the pulse former circuit shown, is similar to that of the pulse former described in FIGURE 2. The pulse output from the pulse former is coupled through capacitor 104 to the gate which is a bi-directional NPN type RCA 2N1169 operating as described above with reference to FIGURE 3.

This series gate is extremely efficient in that it introduces no additional pulse in the output. This is because the pulse current flows only from the base to the emitter so that no current pulse appears in the collector output. The RF signal from the mixer stage passes through capacitor 114 and flows from the emitter to collector of the series transistor gate, and then out through capacitor 118 to the IF section of the receiver.

The following values for the corresponding numbers given to elements of the above circuit are as follows:

Transformer 70—5.0 mc., 25 microhenries, 3 turns ratio.
Transformers 80 and 90—5.0 to 5.5 mc., 25 microhenries.

| Resistors (½ watt carbon): | Ohms |
|---|---|
| 71 | 10,000 |
| 73 | 56,000 |
| 77 | 820 |
| 82 | 220,000 |
| 83 | 56,000 |
| 89 | 820 |
| 93 | 100,000 |
| 96 | 1,000,000 |
| 100 | 18,000 |
| 102 | 560,000 |
| 106 | 1,000,000 |
| 108 | 680 |
| 110 | 3,300 |
| 112 | 1,200 |

| Capacitors: | Microfarads |
|---|---|
| 72 | 15 |
| 75 | .001 |
| 76 | .01 |
| 78 | 27 |
| 84 | 15 |
| 85 | .001 |
| 86 | .01 |
| 87 | 27 |
| 92 | 33 |
| 94 | 100 |

| Capacitors: | Microfarads |
|---|---|
| 97 | .01 |
| 101 | .01 |
| 104 | .1 |
| 114 | .1 |
| 118 | .1 |

Figure 5:
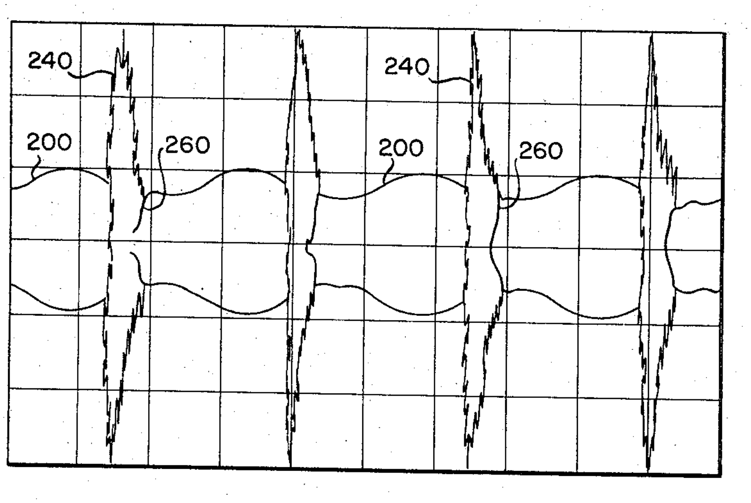
FIGURE 5 represents an oscilloscope picture of a signal containing noise, taken from the circuit of FIGURE 1 immediately beyond the gate when the silencer circuit is disconnected.
Figure 6:
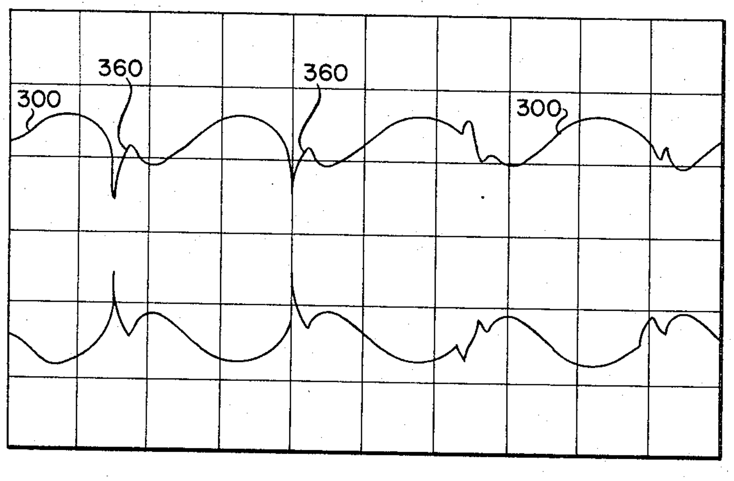
FIGURE 6 represents an oscilloscope picture of the noise-free signal obtained with the same arrangement as FIGURE 5 except that the silencer circuit is connected in circuit.

The exceptional performance of a receiver using the above described noise silencing technique is very clearly shown in FIGURES 5 and 6 which represent oscilloscope pictures showing the output of a one megacycle intermediate frequency stage with a 5-kilocycle 6-decibel bandwidth, the input being a 3.75 megacycle signal modulated 30% at 400 cycles per second at 30-microvolt level. Simultaneously, a noise burst of peak level 30,000 microvolts was injected into the antenna input, the noise burst being made synchronous with the 400-cycle per second modulation to make photography possible.

In FIGURE 5, the silencer is "off" and the noise pulse 240 completely disrupts the signal 200 as shown at 260. In the receiver checked here, the pulse was also actuating the automatic gain control and thereby reducing the receiver gain.

In FIGURE 6, the same signals and noise pulse were fed into the unit, with the silencer turned "on." Inasmuch as the automatic gain control is no longer being actuated by the noise pulses, the signal level increases. The noise pulses as such have been eliminated, and the modulation envelope 300 merely shows several breaks 360. This envelope is readily smoothed by the selectivity of the receiver, and by the detector, and audio filtering.

The audible effect in this instance is to go from a situation where only noise and a weak 400-cycle per second tone can be heard to one in which only a clear 400-cycle per second note is heard with a faint buzzing in the background.

It should be noted that the noise silencer prevents pulses from being lengthened by the selectivity of the receiver, which now with the operation of the gate, tends instead to smooth the signal so that no reduction in signal quality occurs.

Also note that while the receiver hears only a narrow band of from 2 kilocycles to 200 cycles per second signal, the gate is actuated by signals over a very wide band in which much noise enters the bandspread. Furthermore, noise pulses of all amplitudes greater than the mean signal close the gate equally well, and that the gate action is extremely fast because it is derived from a broad band source.

While the invention has been described in connection with different embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains, and as may be applied to the essential features hereinbefore set forth and as fall within the scope of the invention or the limits of the appended claims.

Having thus described my invention, I claim:

1. A signal gating circuit, comprising, a conductor for carrying an electrical signal from one electrical stage to a second electrical stage, a bi-directional switching transistor having its emitter-collector function connected in series in said conductor between said stages, and having its base biased so that the emitter-collector impedance is negligible, and gate control means connected to said base of said switching transistor which transmits a control signal to said base to overcome the bias thereon, the change of bias acting to raise the emitter-collector impedance to a very high value and thereby cut-off said electrical signal.

2. The signal gating circuit as set forth in claim 1, wherein said transistor has a considerably smaller input electrode resistive connection to ground than an output electrode resistive connection to ground, so that a control signal applied to the base of said transistor will not appear in the output thereof.

3. A signal gating circuit, comprising a conductor for carrying an electrical signal from one electrical stage to a second electrical stage, a high impedance transformer having primary and secondary coils and having its primary coil connected in parallel with said conductor, a bi-polarized switching transistor having its emitter and collector connected across the secondary coil of said transformer, said transistor having its base biased to produce a very high collector-emitter impendance, control means connected to the base of transistor to overcome said bias, the collector-emitter impedance dropping to a very low value when said bias is overcome, whereby the impedance of the transformer is significantly lowered to thereby affect passage of said electrical signal in said conductor.

4. A pre-IF noise silencer, comprising, a conductor for carrying a radio frequency signal from one electrical stage to a second electrical stage, an envelope detector connected to said conductor which gives an output voltage when noise signals are present in said radio frequency signal, a pulse former connected to said envelope detector which emits a sharp, well-defined control pulse on receiving an output voltage from said envelope detector, a bi-directional transistor gate connected to said conductor and to said pulse former, said gate normally passing said radio frequency signal therethrough, but being responsive to said control pulse to interrupt said signal upon receipt of said control pulse.

5. A pre-IF noise silencer as set forth in claim 4 wherein said envelope detector is a diode, and said pulse former is a pentode which is biased below cut-off.

6. A pre-IF noise silencer as set forth in claim 4 wherein said transistor has its emitter-collector junction connected in series with said conductor, and its base biased to provide a low impendance between said collector and emitter.

7. A pre-IF section for a radio receiver for silencing impulse noise, comprising, a tuner which receives and passes a wide bandwidth radio frequency signal, a first mixer stage which receives the signal passed from the tuner and mixes it with an oscillator signal without reducing the wide bandwidth radio frequency signal, detector means for scanning the output signal from the mixer stage and producing a signal when noise is present in said output signal, pulse forming means which receives the signal from said detector means and produces a pulse output in response thereto, a second mixer stage which receives the output signal from the first mixer stage and mixes it with a second oscillator signal, and bi-directional transistor gate means connected to said second mixer stage for normally passing the signal output to an IF section, said transistor having a base electrode which is connected to the pulse forming means and being responsive to said pulse output to interrupt the passage of said signal output of said second mixer stage, whereby no signal noise is passed on to the IF section.

8. The pre-IF section for a radio receiver as set forth in claim 7, wherein said first and second mixer stages are beam deflection mixer tubes, and said gate is a bi-directional transistor having its emitter-collector junction connected in series with the output of said second mixer, and having its base biased to provide a normally low impendance between the emitter and collector of the transistor.

9. In a front end for a radio receiver, wherein the radio signal is passed through a tuner section from an antenna and then through a mixer section prior to selective filtering, the combination with said sections of a bi-directional transistor gate circuit wherein said radio signal is passed through the emitter-collector junction, a wide band width envelope detector means connected in circuit with said sections for producing a voltage output for the duration of any noise occurring in a wide band of radio signals, and a pulse former stage connected to said detector and to said transistor gate circuit which produces a sharp identical amplitude current pulse for all noise produced voltage output from said detector means, said transistor gate circuit having a transistor to the base junction of which said pulse former stage is connected, the magnitude of all pulses from said pulse former stage being the exact value required by said transistor to abruptly change the transistor impedance to interrupt passage of radio signals through said transistor gate circuit without introducing perturbation in said signal.

10. The front end section for a radio receiver as set forth in claim 9, wherein said pulse former stage is a high transconductance pentode which is biased below cut-off, and wherein the screen and plate voltages limit the amplitude of all pulses produced.

References Cited

UNITED STATES PATENTS

| | | | |
|---|---|---|---|
| 3,140,446 | 7/1964 | Myers et al. ------ | 325—324 X |
| 3,195,052 | 7/1965 | Cohn et al. -------- | 325—479 |

OTHER REFERENCES

Dept. of Army Technical Manual TM11–690, March 1959, pp. 191–193.

KATHLEEN H. CLAFFY, *Primary Examiner.*

R. LINN, *Assistant Examiner.*